United States Patent [19]

Sekiya

[11] Patent Number: 4,947,598
[45] Date of Patent: Aug. 14, 1990

[54] METHOD FOR GRINDING THE SURFACE OF A SEMICONDUCTOR WAFER

[75] Inventor: Mitsuo Sekiya, Tokyo, Japan

[73] Assignee: Disco Abrasive Systems, Ltd., Tokyo, Japan

[21] Appl. No.: 486,464

[22] Filed: Apr. 19, 1983

[30] Foreign Application Priority Data

Apr. 23, 1982 [JP] Japan ................................. 57-68161

[51] Int. Cl.[5] .............................................. B24B 1/00
[52] U.S. Cl. .................... 51/283 R; 51/325; 125/11.01; 125/11.19
[58] Field of Search ............. 51/283 R, 283 E, 281 R, 51/281 E, 325, 211 R, 292, 262 T; 125/11 R, 11 DF

[56] References Cited

U.S. PATENT DOCUMENTS 4,226,055 10/1980 Komanduri et al. ................. 51/325
4,411,107 10/1983 Sekiya et al. ....................... 51/209 R

FOREIGN PATENT DOCUMENTS 2505713 11/1982 France ............................... 51/283 R
0393073 12/1973 U.S.S.R. ............................. 51/325

OTHER PUBLICATIONS

"Diamond Wheel Catalog"; Accurate Diamond Tool Corporation, Catalog No. 72.

Primary Examiner—Robert A. Rose
Attorney, Agent, or Firm—Beveridge, DeGrandi & Weilacher

[57] ABSTRACT

A dresser made of bonded alundum-type abrasive is ground by a rotating blade made of bonded super abrasive to dress the blade. The surface of a semiconductor wafer is ground by the rotating dressed blade to convert it into a matte-finished surface substantially free from saw marks.

20 Claims, 3 Drawing Sheets

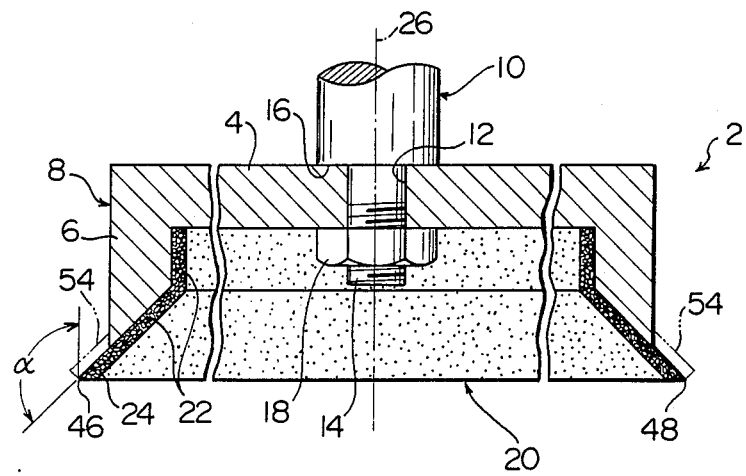
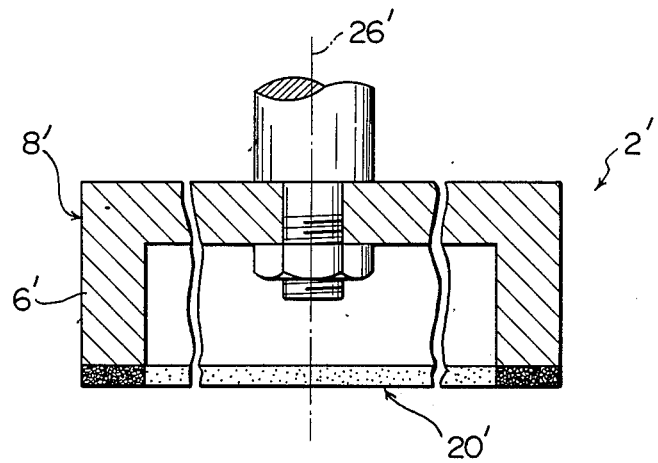

METHOD FOR GRINDING THE SURFACE OF A SEMICONDUCTOR WAFER

FIELD OF THE INVENTION

This invention relates to a method for grinding the surface of a semiconductor wafer, and more specifically, to a method for grinding the surface of a semiconductor wafer to obtain a so-called matte finish.

DESCRIPTION OF THE PRIOR ART

It is well known that the production of a semiconductor wafer generally starts with the formation of a nearly cylindrical ingot composed of highly pure silicon or such a semiconductor material as GaAs or GaP. The ingot is sliced to a suitable thickness to obtain a number of nearly disc-shaped semiconductor wafers. Both surfaces of each wafer are subjected to abrasive machining, and then etched in a suitable mixed acid solution. One surface of each wafer is then polished to obtain a mirror surface. Circuits are applied to the mirror surface of the resulting semiconductor wafer by printing, etc., and the other surface of the wafer is further subjected to abrasive machining.

In the aforesaid abrasive machining before providing circuits, the two surfaces of a semiconductor wafer are generally matte-finished. When the wafer surface is ground by using a rotating blade made of bonded super abrasive, considerably noticeable "saw marks" are generally formed on the ground surface. The saw marks extend in the moving direction of the bonded super abrasive relative to the wafer surface, and impart undesirable directionality to the semiconductor wafer. It has been the previous practice, therefore, to subject the wafer surface to abrasive machining by so-called lapping with loose abrasive. Usually, the lapping is carried out by interposing a lapping liquor containing loose abrasive between the surfaces of the semiconductor wafer and the surfaces of lapping plates, and moving the semiconductor wafer and the lapping plates relative to each other while they are pressed against each other under a suitable pressure. This lapping process can give semiconductor wafer surfaces of matte finish which is substantially free from saw marks.

The lapping process, however, has the defects that (a) its operational efficiency is much lower than that of machining by bonded abrasive; (b) the semiconductor wafer is contaminated by the lapping liquor, and therefore, the lapped wafer requires subsequent washing and drying steps which are troublesome; and (c) the lapping process is difficult for factory automation.

SUMMARY OF THE INVENTION

It is an object of this invention to provide a novel and excellent method for grinding the surface of a semiconductor wafer, by which the wafer surface can be ground with sufficient operational efficiency in an easily automatable mode without giving rise to such problems as the contamination of the wafer to provide a matte-finished surface which is substantially free from saw marks.

It has previously been thought that grinding the surface of a semiconductor wafer with bonded abrasive necessarily results in the formation of considerably noticeable saw marks on the ground surface. It has now been found surprisingly as a result of extensive investigations and experiments of the present inventor that when the blade is dressed by grinding a dresser made of bonded alundum-type abrasive prior to grinding of the wafer surface by the blade, the surface of the semiconductor wafer can be sufficiently well ground by the dressed blade to provide a ground surface of matte finish which has little or no saw marks.

According tho this invention, there is provided a method for grinding the surface of a semiconductor wafer by a rotating blade made of bonded super abrasive, said method comprising dressing said blade, prior to the grinding of the wafer surface, by grinding a dresser made of bonded alundum-type abrasive with said rotating blade.

Other objects of this invention will become apparent from the following description.

BRIEF DESCRIPTION OF THE DRAWINGS

FIG. 1 is a sectional view showing one embodiment of a grinding wheel which can be used in the method of this invention;

FIG. 2 is a sectional view of another embodiment of a grinding wheel which can be used in the method of this invention;

DETAILED DESCRIPTION OF THE PREFERRED EMBODIMENTS

Figure 3:
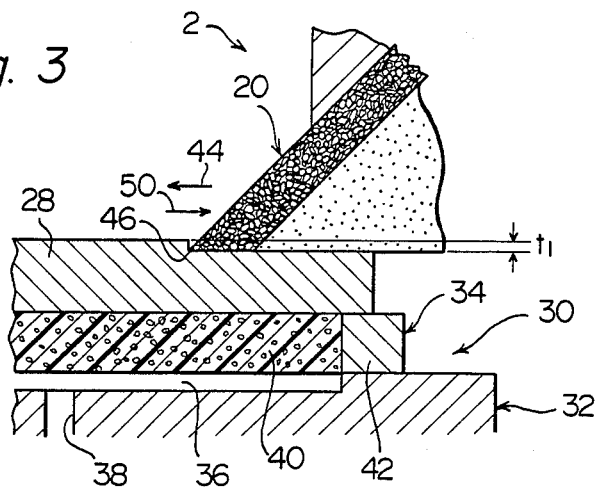
FIG. 3 is a partial sectional view showing one example of the manner of dressing the blade of the grinding wheel shown in FIG. 1.

The invention is described below in greater details with reference to the accompanying drawings.

FIG. 1 illustrates one embodiment of a grinding wheel which can be used in the method of this invention. The illustrated grinding wheel at 2 has a support member 8 comprising a circular base portion 4 and a cylindrical downwardly extending portion 6 extending downwardly from the peripheral edge of the base portion 4. Conveniently, the support member 8 is made of a suitable metallic material such as aluminum. The central portion of the base portion 4 of the support member 8 is mounted on a rotating shaft 10 by a suitable method. In the illustrated embodiment, a through hole 12 is formed centrally at the base portion 4, and a small-diameter portion 14 having an external thread formed at its peripheral surface is formed at the lower end portion of the rotating shaft 10. The support member 8 is detachably mounted on the rotating shaft 10 by inserting the small-diameter portion 14 through the hole 12 to cause the upper surface of the base portion 4 to abut against a shoulder portion 16 of the rotating shaft 10, and screwing a nut 18 onto a projecting end portion of the small-diameter portion 14 projecting through the hole 12.

The free end portion, i.e. the downwardly extending portion 6 of the support member 8 has a blade 20. It is critical that the blade 20 should be made of bonded super abrasive. The super abrasive may, for example, be cubic boron nitride grains or the like, but preferably natural or synthetic diamond grains. The diamond may have a grain size of 1200 to 100 mesh, preferably 1000 to 150 mesh, especially preferably 800 to 230 mesh (U.S. mesh number). Super abrasive can be formed into the blade 20 by bonding them in accordance with a metal bonding method comprising using a suitable metal bonding agent such as nickel, copper or brass, a vitrified bonding method comprising using a clay bonding agent capable of being vitrified upon heating, a resinoid bonding method comprising using a thermosetting resin bonding agent, etc. When the super abrasive is diamond grains, they can be conveniently bonded by the metal bonding method. When metal bonded diamond abrasive is used, it can be formed into a blade 20 of a predetermined shape and then bonded to a predetermined position of the support member 8, as in the case of the blade 20 made of vitrified bonded or resinoid bonded super abrasive. From the viewpoint of the strength, etc. of the blade 20, however, it is preferred to form the blade 20 and simultaneously bond it to the predetermined position of the support member 8 directly by a plating method known per se which involves using an electrolytic solution containing nickel cation, etc.

In the illustrated embodiment, the under surface of the downwardly extending portion 6 of the support member 8 is inclined radially outwardly in the downward direction. The blade 20 has a bonded portion 22 extending along the inside surface and under surface of the downwardly extending portion 6 and a free end portion 24 extending radially outwardly in the downward direction beyond the lower end of the outside surface of the downwardly extending portion 6. The angle $\alpha$ formed between the axis 26 of rotation of the blade 20 and the free end portion 24 of the blade 20 is suitably 100 to 160 degrees, preferably 110 to 150 degrees, especially preferably 120 to 140 degrees. Too large angles $\alpha$ dull the blade 20 in grinding the surface of a semiconductor wafer in the manner to be described hereinafter. If the angle $\alpha$ is too small, the grinding resistance acting on the blade 20 becomes too high during the grinding process, and the required strength of the blade 20 becomes considerably high. The suitable thickness of the blade 20, especially its free end portion 24, is 0.05 to 2.00 mm, preferably 0.08 to 1.00 mm, especially preferably 0.10 to 0.50 mm. When the thickness becomes too large, the area of contact between the blade 20 and the semiconductor wafer during the grinding process increases. The increased contact area dulls the blade 20 and a relatively large amount of expensive super abrasive is required. If the thickness is too small, the strength of the blade 20 becomes too low. Preferably and not essentially, the blade 20 is of an annular shape extending continuously along the entire circumference of the downwardly extending portion 6 of the support member 8. If desired, a plurality of slots may be formed at circumferentially spaced positions in the free end portion 24 of the blade 20. These slots can permit flowing of cooling water therethrough during the grinding process to be described hereinafter. Furthermore, grinding chips from the semiconductor wafer can easily escape through these slots. Thus, the grinding effect can be increased by provinding such slots. If further desired, it is possible to make the free end portion 24 of the blade 20 wavy in its circumferential section, or to provide two or more blades 20 concentrically at the downwardly extending portion 6 of the support member 8.

FIG. 2 illustrates another embodiment of the grinding wheel which can be used in the method of this invention. In the grinding wheel 2' shown in FIG. 2, the under surface of the downwardly extending portion 6' of the support member 8' extends substantially perpendicularly to the axis 26' of rotation. An annular flat blade 20' is provided along the under surface of the downwardly extending portion 6'. Otherwise, the grinding wheel 2' shown in FIG. 2 is substantially the same as the grinding wheel 2 shown in FIG. 1.

In the embodiments illustrated in FIGS. 1 and 2, the support member 8 or 8' having the cylindrical downwardly extending portion 6 or 6' is used, and the blade 20 or 20' is provided at the downwardly extending portion 6 or 6'. Instead of this structure, there can be used an alternative structure in which a support member in the shape of a circular flat plate is used and a blade is provided at the annular free end portion, i.e. the peripheral edge portion, of the support member.

In the method of this invention, it is important that prior to grinding of the surface of a semiconductor wafer by the blade 20 or 20' of the grinding wheel 2 or 2', the blade 20 or 20' should be dressed by grinding a dresser made of bonded alundum-type abrasive with the blade 20 or 20'.

One example of the manner of dressing the blade 20 of the grinding wheel 2 is described with reference to FIG. 3. A dresser 28 is held by a holding member 30. The illustrated holding member 30 has a base stand 32 and a holding plate 34 fixed to the upper surface of the base stand 32. The base stand 32 which may be of a disc-like shape as a whole has formed on its upper surface a circular depression 36 and a passage 38 extending downwardly from the circular depression 36. The passage 38 is connected to a suitable vacuum source (not shown). The holding plate 34 which may be discshaped has a main portion 40 made of a porous material and an annular outside portion 42 fixed to its peripheral edge. By securing the under surface of the annular outside portion 42 fixedly to the upper surface of the base stand 32, the holding plate 34 is fixed to the base stand 32, and the main portion 40 covers the depression 36. The dresser 28 which may be disc-shaped is placed on the holding plate 34 to cover its main portion 40. When the vacuum source (not shown) is operated, air is sucked through the main portion 40 of the holding plate 34, the depression 36 and the passage 38, whereby the dresser 28 is attracted to, and held on, the holding plate 34.

It is essential that the dresser 28 should be formed by bonded alundum(alumina)-type abrasive. Alundum-type abrasive which can be conveniently used in the invention are, for example, those called by symbols A, 32A, WA, and RA. Alundum-type abrasive can be bonded by a vitrified bonding method involving using a clay bonding agent capable of being vitrified upon heating, or a resinoid bonding method involving using a thermosetting resin bonding agent.

Conveniently, the grinding wheel 2 is provided such that its axis 26 (FIG. 1) of rotation is nearly perpendicular to the upper surface of the dresser 28; more specifically, the axis 26 of rotation is inclined to the upper surface of the dresser 28 only slightly so that as viewed in the moving direction (shown by an arrow 44) of the grinding wheel 2 relative to the dresser 28, the lower end 48 (FIG. 1) of the blade 20 at its rear end is higher than the lower end 46 of the blade 20 at its front end by several tens of μm. The grinding wheel 2 is rotated about its axis of rotation by a driving source (not shown) such as an electric motor drivingly connected to the rotating shaft 10. Moreover, by moving the holding member 30 in the direction of an arrow 50 or instead of, or in addition to, this operation, moving the grinding wheel 2 in the direction of an arrow 44, the grinding wheel 2 and the dresser 28 are moved relative to each other in the directions shown by arrows 44 and 50, i.e. in the directions nearly perpendicular to the axis 26 of rotation of the grinding wheel 2 and substantially parallel to the upper surface of the dresser 28. Thus, the dresser 28 is ground by the blade 20 of the grinding wheel 2, and as a result, the blade 20 is dressed. The peripheral speed of the blade 20, the speed of relative movement of the grinding wheel 2 and the dresser 28 in the directions of arrows 44 and 50, and the grinding depth t1 during the dressing operation can be properly preset.

According to the method of this invention, after the aforesaid dressing operation, the surface of a semiconductor wafer is ground by the dressed blade 20 of the grinding wheel 2.

Figure 4:
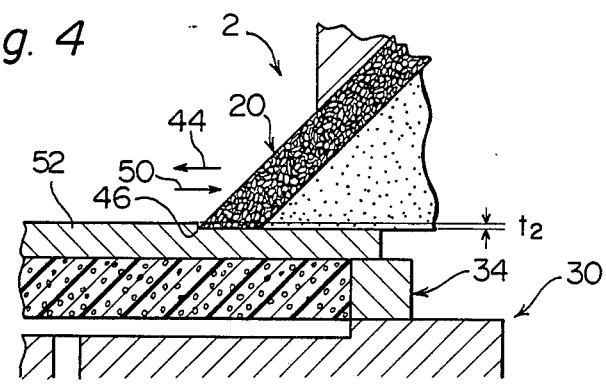
FIG. 4 is a partial sectional view showing one example of the manner of grinding the surface of a semiconductor wafer by the grinding wheel shown in FIG. 1 whose blade has been dressed in accordance with this invention.
Figure 6:
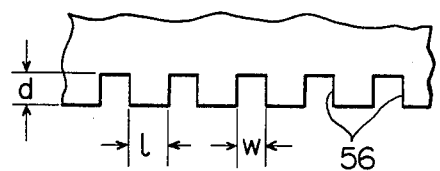
FIG. 6 is an enlarged partial front view showing the free end portion of the blade of the grinding wheel used in Example 6 of the present application.

FIG. 4 shows one example of the manner of grinding the surface of a semiconductor wafer 52 by the blade 20 of the grinding wheel 2. It will be readily appreciated from a comparative study of FIGS. 3 and 4 that grinding can be carried out in substantially the same manner as the aforesaid dressing. Specifically, the semiconductor wafer which may be a nearly circular wafer made of highly pure silicon or such a suitable semiconductor material as GaAs or GaP is placed on the holding plate 34 of the holding member 30 with its surface to be grounded facing upwardly, and is thus attracted to, and held on, the holding plate 34. Conveniently, the grinding wheel 2 is disposed such that its axis 26 (FIG. 1) of rotation is nearly perpendicular to the upper surface of the semiconductor wafer 52; more specifically, the axis 26 of rotation is inclined to the upper surface of the semiconductor wafer 52 only slightly so that as viewed in the moving direction (shown by arrow 44) of the grinding wheel 2 to relative to the semiconductor wafer 52, the lower end 48 (FIG. 1) of the blade 20 at its rear end is higher than the lower end 46 of the blade 20 at its front end by several tens of μm. The grinding wheel 2 is rotated about its axis 26 of rotation. Moreover, by moving the holding member 30 in the direction of arrow 50, or instead of, or in addition to, this operation, moving the grinding wheel 2 in the direction of arrow 44, the grinding wheel 2 and the semiconductor wafer 52 are moved relative to each other in the directions of arrows 44 and 50, i.e. in the directions nearly perpendicular to the axis 26 of rotation of the grinding wheel 2 and substantially parallel to the upper surface of the semiconductor wafer 52. Thus, the upper surface of the semiconductor wafer 52 is ground by the blade 20. The suitable peripheral speed of the free end of the blade 20 during this grinding operation is 200 to 3000 m/min., preferably 300 to 2000 m/min., especially preferably 400 to 1300 m/min. Generally, the speed of relative movement of the grinding wheel 2 and the semiconductor wafer 52 in the directions of arrows 44 and 50 is desirably not more than 1000 mm/min. The grinding depth t2 can be properly set according to the thickness of reduction of the semiconductor wafer 52 by grinding. For example, in the grinding of the surface of a semiconductor wafer before application of circuits, the grinding depth t2 is generally set at 10 to 20 μm. In the grinding of the surface of a semiconductor wafer after application of circuits, it is generally set at several hundred μm.

In the case of using the grinding wheel 2' illustrated in FIG. 2, it is possible to dress the blade 20' and then grind the surface of the semiconductor wafer 52 by the dressed blade 20' in the similar manner as mentioned above. In this case, however, because, for example, the area of contact between the blade 20' and the semiconductor wafer 52 is relatively large, the grinding depth t2 tends to be limited to several μm.

According to the method of this invention described hereinabove, the surface of the semiconductor wafer 52 can be ground into a sufficiently good surface of matte finish having little or no saw marks. After the dressed blade 20 has been used a number of times (for example, about 1000 times) to grind semiconductor wafers, saw marks tend to appear on the ground surfaces. In such a case, the blade 20 may again be dressed.

Furthermore, as is well known to those skilled in the art, when one surface of a semiconductor wafer is subjected to abrasive machining, the resultant residual stress undesirably tends to make the semiconductor wafer bow-like. It has been found that according to the method of this invention, this undesirable tendency is much smaller than in other abrasive machining operations including lapping, although no clear reason can be assigned to it.

The following examples illustrate the present invention more specifically.

EXAMPLE 1

A grinding wheel of the form shown in FIG. 1 was produced by plating and subsequent dissolution. More specifically, in the plating step, a nickel plate was immersed in an electrolytic solution containing nickel cation, and used as an anode. An aluminum support member having an annular projecting portion shown by broken lines 54 in FIG. 1 formed as a onepiece unit was coated with an insulating substance excepting the inside and under surfaces of its downwardly extending portion and the inside surface of its projecting portion, and dipped upside down in the electrolytic solution as a cathode. Prior to electrolysis, synthetic diamond abrasive having a size of a U.S. mesh number of 400 were suspended in the electrolytic solution with stirring. Then, electrolysis was started, and the abrasive which fell onto the non-coated portion of the support member by gravity were bonded by the precipitated nickel metal. Thus, a blade was formed. In the subsequent dissolution step, the support member having the formed blade was taken out from the electrolytic solution, and after removing the coating of the insulating substance only from the outside surface of the projecting portion of the support member, dipped in a solution of sodium hydroxide. Thus, the projecting portion of the support member was removed by dissolution. Thereafter, the support member was taken out from the sodium hydroxide solution, and all the remaining coating of the insulating substance was removed. As a result, a grinding wheel shown in FIG. 1 was produced.

The free end portion of the blade in the grinding wheel so produced has a thickness of 0.30 mm, and the angle α (FIG. 1) formed between the free end portion of the blade and the axis of rotation of the grinding wheel was 135 degrees. The free end of the blade has an outside diameter of 200 mm.

The blade of the grinding wheel was dressed in the manner described hereinabove with reference to FIG. 3. At this time, there was used a disc-shaped dresser having a thickness of 4 mm and an outside diameter of 4 inches and a designation WA320NB (showing a dresser obtained by bonding WA abrasive having a U.S. mesh number of 320 with a bonding degree of N) according to the internationally recognized marking system representing the characteristics of grindstone. The peripheral speed of the free end of the blade was 1250 m/min. The holding member holding the dresser was moved at a speed of 150 mm/min. in the direction of arrow 50. The grinding depth t1 was 50 μm. Cooling water was jetted into the grinding zone.

After the aforesaid dressing operation, one surface of a silicon wafer was ground by the dressed blade in the manner described hereinabove with reference to FIG. 4. At this time, the peripheral speed of the free end of the blade was 1250 m/min. The holding member holding the silicon wafer was moved at a speed of 150 mm/min. in the direction of arrow 50. The grinding depth t2 was 15 μm. Cooling water was jetted into the grinding zone.

Figure 5:
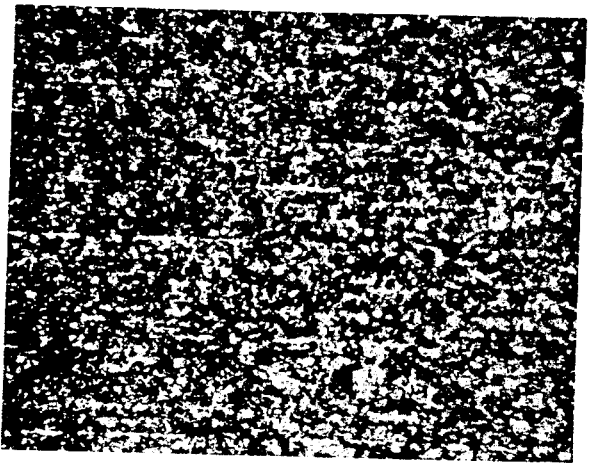
FIG. 5 is a photograph, enlarged to 200 times, of the surface of a silicon wafer ground in Example 1 of the present application.

FIG. 5 is a photograph, enlarged to 200 times, of the silicon wafer ground as above. FIG. 5 clearly shows that the ground surface was a matte-finished surface substantially free from saw marks.

EXAMPLES 2 TO 5

The surface of a silicon wafer was ground in the same way as in EXAMPLE 1 except that the various conditions shown in Table 1 were used. In each run, the ground surface of the silicon wafer was a matte-finished surface substantially free from saw marks as in the surface shown in FIG. 5.

TABLE 1

| Example | Grain size of synthetic diamond abrasive used in forming the blade (U.S. mesh number) | Characteristics of the dresser | Dressing conditions Peripheral speed of the free end of the blade (m/min.) | Moving speed of the holding member (mm/min.) |
|---|---|---|---|---|
| 2 | 320 | RA80NB (*1) | 3000 | 200 |
| 3 | 400 | Al150NB (*2) | 3000 | 150 |
| 4 | 600 | WA320NB (*3) | 3000 | 150 |
| 5 | 320 | WA150LV (*4) | 3000 | 200 |

(*1): Dresser obtained by bonding RA abrasive having a U.S. mesh number of 80 with a bonding degree of N in accordance with a resinoid bonding method.
(*2): Dresser obtained by bonding ordinary A abrasive having a U.S. mesh number of 150 with a bonding degree of N in accordance with a resinoid bonding method.
(*3): Dresser obtained by bonding WA abrasive having a U.S. mesh number 320 with a bonding degree of N in accordance with a resinoid bonding method.
(*4): Dresser obtained by bonding WA abrasive having a U.S. mesh number 150 with a bonding degree of L in accordance with a vitrified bonding method.

EXAMPLE 6

A grinding wheel was produced in substantially the same way as in Example 1 except that synthetic diamond abrasive having a U.S. mesh number of 320 was used, and the resulting blade had slots 56 having a width w of 1 mm and a depth d of 1 mm formed circumferentially at an interval l of 1.5 mm.

The blade of the grinding wheel was dressed in the same way as in Example 1 except that the dresser used was RA80NB (obtained by bonding RA abrasive having a U.S. mesh number of 80 with a bonding degree of N in accordance with a resinoid bonding method), the peripheral speed of the free end of the blade was 650 m/min., and the moving speed of the holding member was 80 mm/min.

Thereafter, the surface of a silicon wafer was ground in the same way as in Example 1 by the dressed blade except that the peripheral speed of the free end of the blade was 650 m/min. and the moving speed of the holding member was 80 mm/min.

The ground surface of the silicon wafer was a matte-finished surface substantially free from saw marks as in the surface shown in FIG. 5.

EXAMPLE 7

A grinding wheel having the form shown in FIG. 2 and including a blade with an outside diameter of 200 mm, an inside diameter of 190 mm and a thickness of 2 mm was produced by bonding synthetic diamond abrasive having a U.S. mesh number of 400 by resinoid bonding method to form a blade and bonding the blade to a support member.

The blade of the grinding wheel was then dressed in the same way as in Example 1.

The surface of a silicon wafer was ground in the same way as in Example 1 by using the dressed blade except that the grinding depth t2 was set at 3 μm.

Figure 7:
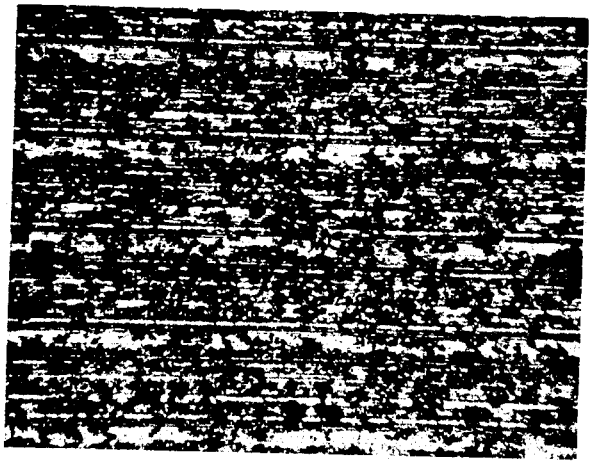
FIG. 7 is a photograph, enlarged to 200 times, of the surface of a silicon wafer which was ground in Example 7 of the present application.

FIG. 7 is a photograph, enlarged to 200 times, of the surface of the silicon wafer so ground. FIG. 7 clearly shows that the ground surface was a matte-finished surface on which some saw marks were present.

COMPARATIVE EXAMPLE 1

The blade of the same grinding wheel as produced in Example 1 was dressed in the same way as in Example 1 except that the dresser used was GC320LV (obtained by bonding GC abrasive having a U.S. mesh number of 320 with a bonding degree of L by a vitrified bonding method).

The surface of a silicon wafer was ground by the dressed blade in the same way as in Example 1.

Figure 8:
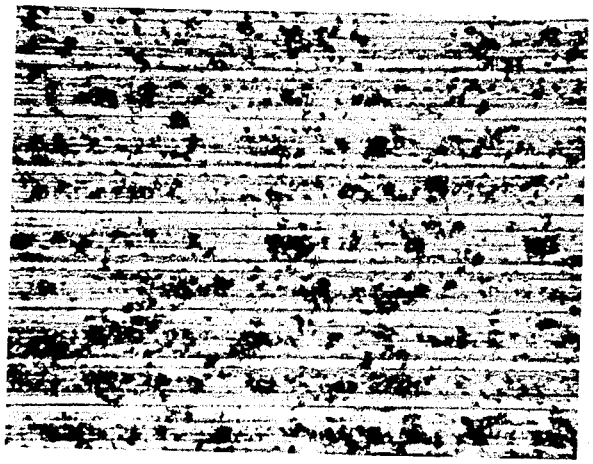
FIG. 8 is a photograph, enlarged to 200 times, of the surface of a silicon wafer which was ground in Comparative Example 1 of the present application.

FIG. 8 is a photograph, enlarged to 200 times, of the surface of the silicon wafer so ground. It is seen from FIG. 8 that the ground surface had conspicuous saw marks, and did not have a matte-finish.

What is claimed is:

1. A method for grinding the surface of a semiconductor wafer wherein a rotary blade made of bonded super abrasive is used for said grinding comprising:
    carrying out an initial blade dressing step prior to said wafer grinding, said blade dressing step comprising grinding a dresser made of bonded alundum-type abrasive with said rotary blade; and thereafter
    mounting the wafer on a holding member, disposing said rotary blade made of bonded super abrasive so that its axis of rotation is generally perpendicular to the wafer surface, rotating said rotary blade and grinding the wafer surface with the rotating blade by relatively moving the rotating blade and the holding member in a direction generally perpendicular to the axis of rotation;
    the blade being made of bonded diamond abrasive and the diamond abrasive having a grain size corresponding to a U.S. mesh number of 1200 to 100.

2. The method of claim 4 wherein the blade dressing step includes mounting the dresser on the holding member, rotating the blade and grinding the dresser with the rotating blade by relatively moving the blade and the dresser in a direction generally perpendicular to the axis of rotation.

3. The method of claim 1 wherein the semiconductor wafer is made of silicon.

4. The method of claim 1 wherein said semiconductor wafer is that before providing circuits thereon.

5. The method of claim 4 wherein the diamond abrasive has a grain size corresponding to a U.S. mesh number of 1000 to 150.

6. The method of claim 5 wherein the diamond abrasive has a grain size corresponding to a U.S. mesh number of 800 to 230.

7. The method of claim 1 wherein the blade is provided in the annular free end portion of a rotating support member.

8. The method of claim 7 wherein the blade is of an annular shape extending along the entire circumference of the annular free end portion of the support member.

9. The method of claim 1 wherein the diamond abrasive is bonded by plating.

10. The method of claim 1 wherein the blade is formed into a predetermined shape by bonding the diamond abrasive by a metal bonding method.

11. The method of claim 1 wherein at least the free end portion of the blade extends at an angle $\alpha$ of 100 to 160 degrees to the axis of rotation of the blade.

12. The method of claim 11 wherein the angle $\alpha$ is 110 to 150 degrees.

13. The method of claim 12 wherein the angle $\alpha$ is 120 to 140 degrees.

14. The method of claim 11 wherein the free end portion of the blade has a thickness of 0.05 to 2.00 mm.

15. The method of claim 14 wherein the free end portion of the blade has a thickness of 0.08 to 1.00 mm.

16. The method of claim 15 wherein the free end portion of the blade has a thickness of 0.10 to 0.50 mm.

17. A method for grinding the surface of a semiconductor wafer wherein a rotary blade made of bonded super abrasive is used for said grinding comprising:

carrying out an initial blade dressing step prior to said wafer grinding, said blade dressing step comprising grinding a dresser made of bonded alundum-type abrasive with said rotary blade; and thereafter mounting the wafer on a holding member, disposing said rotary blade made of bonded super abrasive so that its axis of rotation is generally perpendicular to the wafer surface, rotating said rotary blade and grinding the wafer surface with the rotating blade by relatively moving the rotating blade and the holding member in a direction generally perpendicular to the axis of rotation;

the peripheral speed of the free end of the blade in the wafer grinding step being 200 to 3000 m/min.

18. The method of claim 17 wherein the peripheral speed of the free end of the blade in the wafer grinding step is 300 to 2000 m/min.

19. The method of claim 18 wherein the peripheral speed of the free end of the blade in the wafer grinding step is 400 to 1300 m/min.

20. A method for grinding the surface of a semiconductor wafer wherein a rotary blade made of bonded super abrasive is used for said grinding comprising:

carrying out an initial blade dressing step prior to said wafer grinding, said blade dressing step comprising grinding a dresser made of bonded alundum-type abrasive with said rotary blade; and thereafter mounting the wafer on a holding member, disposing said rotary blade made of bonded super abrasive so that its axis of rotation is generally perpendicular to the wafer surface, rotating said rotary blade and grinding the wafer surface with the rotating blade by relatively moving the rotating blade and the holding member in a direction generally perpendicular to the axis of rotation;

the blade dressing step including mounting the dresser on the holding member, rotating the blade and grinding the dresser with the rotating blade by relatively moving the blade and the dresser in a direction generally perpendicular to the axis of rotation, the relative moving speed of the blade and the semiconductor wafer being not more than 1000 m/min.

* * * * *